(12) United States Patent
Odaira (10) Patent No.: US 10,103,044 B2
(45) Date of Patent: *Oct. 16, 2018

(54) PROCESSING APPARATUS

(71) Applicant: DISCO CORPORATION, Tokyo (JP)

(72) Inventor: Satoshi Odaira, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/880,642

(22) Filed: Jan. 26, 2018

(65) Prior Publication Data

US 2018/0218931 A1   Aug. 2, 2018

(30) Foreign Application Priority Data

Jan. 27, 2017 (JP) .................................. 2017-012995

(51) Int. Cl.
*G06F 19/00* (2018.01)
*H01L 21/67* (2006.01)
*H01L 21/677* (2006.01)
*G06T 11/60* (2006.01)

(52) U.S. Cl.
CPC .. *H01L 21/67276* (2013.01); *H01L 21/67161* (2013.01); *H01L 21/67778* (2013.01); *G06T 11/60* (2013.01)

(58) Field of Classification Search
CPC .................................................. H01L 21/67778
USPC .......... 700/121; 340/687; 438/107; 716/100, 716/110
See application file for complete search history.

(56) References Cited

FOREIGN PATENT DOCUMENTS

JP        2015-008195 A      1/2015

*Primary Examiner* — Mohammad Ali
*Assistant Examiner* — Sheela S Rao
(74) *Attorney, Agent, or Firm* — Greer Burns & Crain, Ltd.

(57) ABSTRACT

A processing apparatus includes a cassette rest unit from which a wafer is fed by an unloading unit and a feed unit to a plurality of processing units, in which the layout of the units can be changed. The processing unit also has a control unit including a display panel for displaying an input screen for entering operating conditions for the units and a memory unit configured to store at least the operating conditions for the units. The memory unit includes an image memory for storing respective plan-view images of the units, and the display panel displays an overall apparatus map representing a combination of the plan-view images of the units as a layout of the processing apparatus in its entirety. The layout of the plan-view images of the units in the overall apparatus map can be changed.

2 Claims, 4 Drawing Sheets

PROCESSING APPARATUS

BACKGROUND OF THE INVENTION

Field of the Invention

The present invention relates to a processing apparatus for processing a wafer.

Description of the Related Art

According to a fabrication process for semiconductor devices and electronic parts, a plate-like workpiece made of any of various materials, such as a semiconductor wafer, and a ceramic substrate, is thinned down to a predetermined thickness by a grinding apparatus or a polishing apparatus, and then divided along projected dicing lines into individual device chips by a cutting blade mounted on the spindle of a cutting apparatus or a laser processing apparatus. In recent years, to meet demands for various processing modes (thinning, and the like) for workpieces, there has been proposed a wafer processing apparatus called a cluster module system in which various processing units are freely combined and interlinked (see Japanese Patent Laid-Open No. 2015-8195). The cluster module system makes it possible to process various different types of device wafers simultaneously.

SUMMARY OF THE INVENTION

The cluster module system is advantageous in that the processing units can be used in combinations that can freely be changed. However, it has heretofore been customary to elaborate and display an overall apparatus map that depicts a fixed representation of a combination of units and their layout. Therefore, each time the combination of units and their layout are changed, it is necessary for the manufacturer of the cluster module system to remake an overall apparatus map. The cluster module system has thus been suffering a lack of flexibility as to the generation and display of overall apparatus maps.

It is therefore an object of the present invention to provide a processing apparatus which is capable of easily displaying an overall apparatus map.

In accordance with an aspect of the present invention, there is provided a processing apparatus including a cassette rest unit configured to place thereon a cassette with a plurality of wafers housed therein, an unloading unit configured to unload a wafer from the cassette placed on the cassette rest unit, a feed unit configured to feed the wafer unloaded from the cassette by the unloading unit, a plurality of processing units disposed adjacent to the feed unit and configured to perform respective different processing processes on the wafer, and a control unit configured to control the cassette rest unit, the unloading unit, the feed unit, and the processing units. In the processing apparatus the layout of the cassette rest unit, the unloading unit, the feed unit, and the processing units can be changed. Further, the control unit includes a display panel for displaying an input screen for entering operating conditions for the units and memory means for storing at least the operating conditions for the units, the memory means includes an image memory for preparing in advance and storing respective plan-view images of the units, the display panel displays an overall apparatus map representing a combination of the plan-view images of the units as a layout of the processing apparatus in its entirety, and the layout of the plan-view images of the units in the overall apparatus map can be changed.

With the processing apparatus according to the present invention, the layout of the plan-view images that represent the units individually can freely be changed. Thus, overall apparatus maps of the processing apparatus can flexibly be generated, changed, and displayed.

Preferably, the memory means includes an operating condition memory for storing operating conditions for a series of units configured to process a wafer in the processing apparatus, and the control unit includes calculating means for at least calculating a total wafer processing time in a current layout of the overall apparatus map on the basis of at least information on the processing of the wafer on the units and information on the operating conditions.

Preferably, the image memory of the memory means stores therein floor area information about the units, and the calculating means calculates a total floor area of the processing apparatus in its entirety displayed in the overall apparatus map on the basis of the floor area information.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
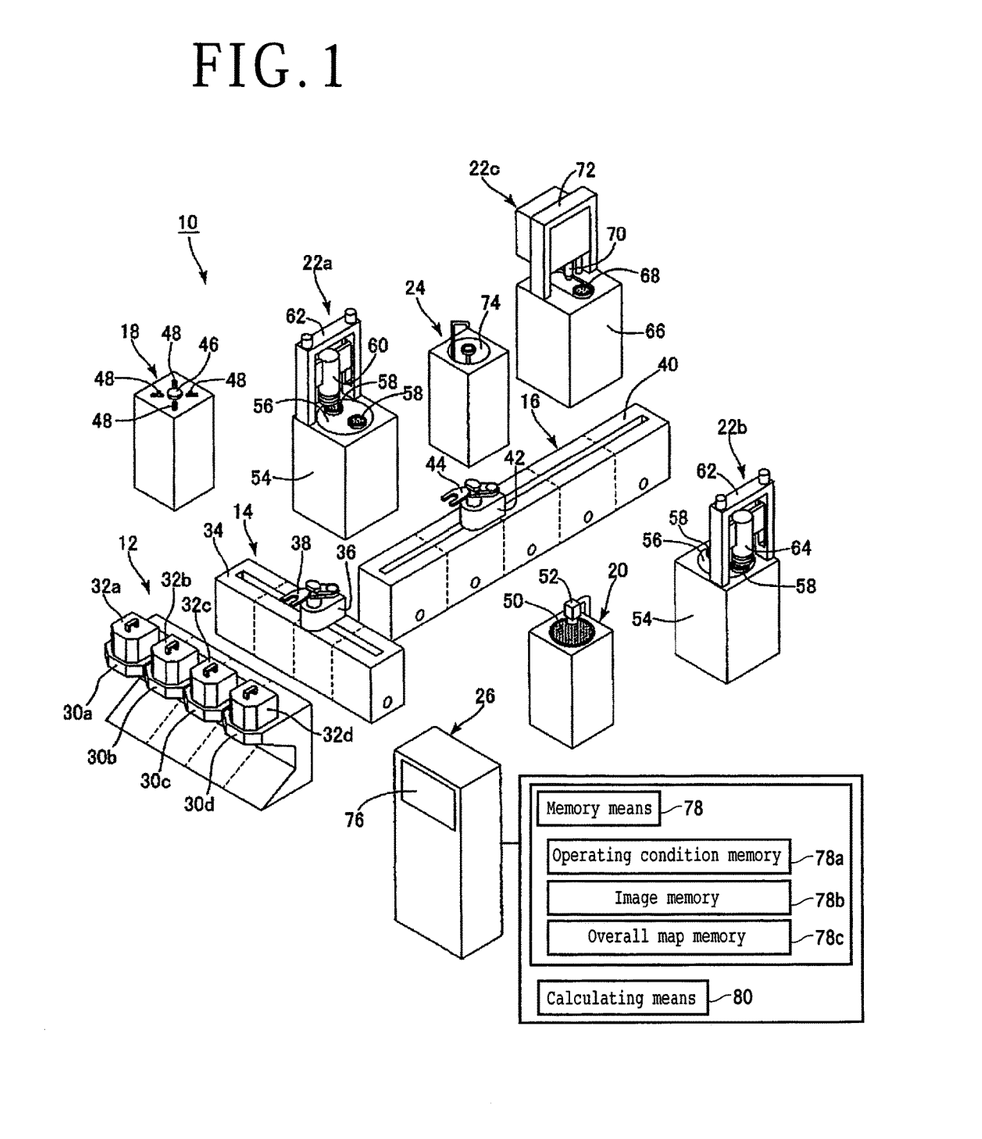
FIG. 1 is an exploded perspective view of a processing apparatus according to an embodiment of the present invention, depicting units thereof as being separate from each other.
Figure 2:
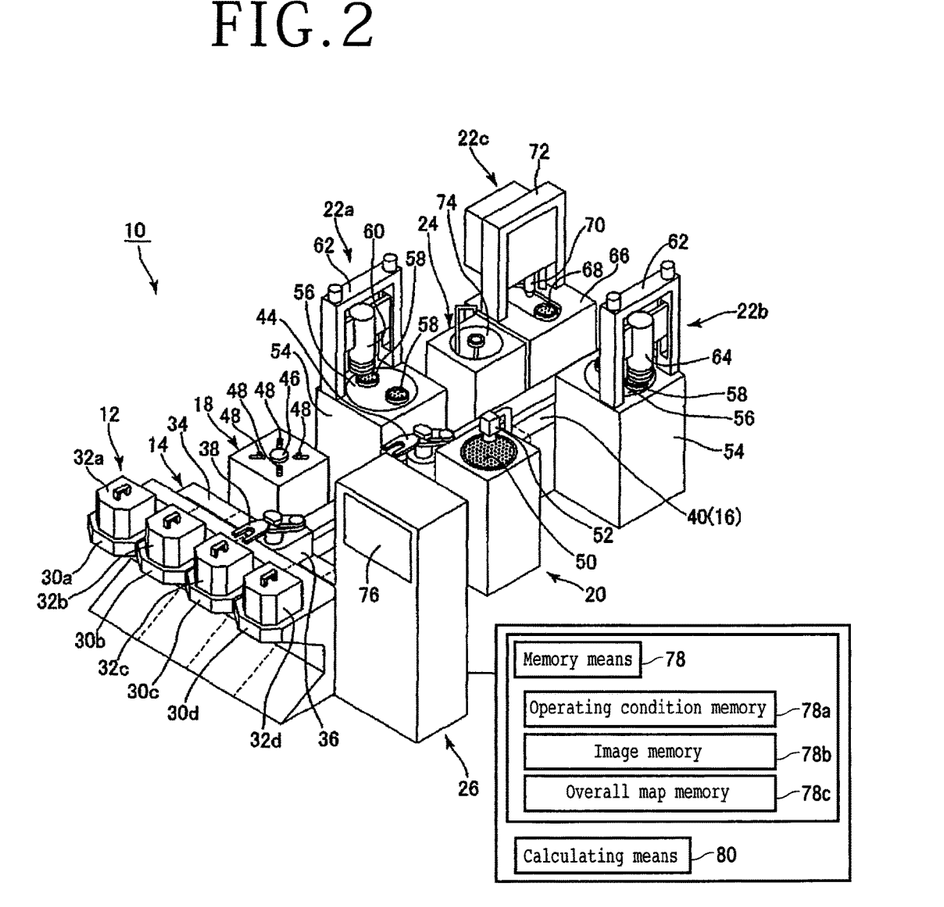
FIG. 2 is a perspective view of the processing apparatus, depicting the units as being put together.

A processing apparatus according to an embodiment of the present invention will be described below with reference to the accompanying drawings. The processing apparatus, denoted by 10 in FIGS. 1 and 2, is a cluster module system made up of a plurality of units that can freely be put together in a combination for performing a series of processing on a wafer not depicted. FIG. 1 depicts the units of the processing apparatus 10 as being separate from each other, and FIG. 2 depicts the units of the processing apparatus 10 as being put together.

As depicted in FIGS. 1 and 2, the processing apparatus 10 includes a cassette rest unit 12, an unloading unit 14, a feed unit 16, a centering unit 18, a wafer inspecting unit 20, a plurality of processing units 22a, 22b, and 22c, a cleaning unit 24, and a control unit 26.

The cassette rest unit 12 includes an array of cassette rest tables 30a, 30b, 30c, and 30d and a plurality of cassettes 32a, 32b, 32c, 32d placed respectively on the cassette rest tables 30a, 30b, 30c, 30d. Each of the cassettes 32a, 32b, 32c, and 32d is capable of housing a plurality of wafers therein.

The unloading unit 14 includes a guide rail 34 extending substantially parallel to the array of the cassette rest tables 30a, 30b, 30c, and 30d of the cassette rest unit 12, moving means 36 movably supported for movement along the guide rail 34, and wafer holding means 38 supported on the moving means 36 for holding a wafer thereon. The guide rail 34 is made up of a plurality of rail units that are separate in the longitudinal direction of the guide rail 34. The boundaries between the rail units are indicated by the broken lines in FIG. 1. The moving means 36 is movably supported for movement in the longitudinal direction of the guide rail 34, and is moved by drive forces generated by a linear motor incorporated in the moving means 36. The wafer holding means 38 includes a multi-axis articulated robot having a wafer holding hand on its distal end. The moving means 26 and the wafer holding means 38 are operated in a coordinated fashion to unload wafers from the cassettes 32a, 32b, 32c, and 32d and load wafers into the cassettes 32a, 32b, 32c, and 32d.

The feed unit 16 includes a guide rail 40 extending perpendicularly to the longitudinal direction of the guide rail 34 of the unloading unit 14, moving means 42 movably supported for movement along the guide rail 40, and wafer holding means 44 supported on the moving means 42 for holding a wafer thereon. The guide rail 40 is made up of a plurality of rail units that are separate in the longitudinal direction of the guide rail 40. The boundaries between the rail units are indicated by the broken lines in FIG. 1. The moving means 42 is movably supported for movement in the longitudinal direction of the guide rail 40, and is moved by drive forces generated by a linear motor incorporated in the moving means 36. The wafer holding means 44 includes a multi-axis articulated robot having a wafer holding hand on its distal end.

The centering unit 18 includes a rest table 46 for placing a wafer on its upper surface and four abutments 48 radially movably disposed surrounding the rest table 46. Each of the abutments 48 includes a cylindrical pin. A wafer placed on the upper surface of the rest table 46 is centered thereon by the four abutments 48 when they are moved radially inwardly toward the center of the rest table 46 while in abutment against the outer edge of the wafer.

The wafer inspecting unit 20 includes a holding table 50 for holding a wafer on its upper surface and detecting means 52 for inspecting a wafer held on the upper surface of the holding table 50. The detecting means 52 measures predetermined properties of a wafer, such as an outside diameter, a thickness, an index size, and a key pattern image for alignment. The detecting means 52 sends measured values to the control means 26.

According to the present embodiment, the processing units 22a, 22b, and 22c include a rough-grinding unit 22a, a finish-grinding unit 22b, and a laser processing unit 22c, respectively. The rough-grinding unit 22a includes a turntable 56 angularly movably supported on a unit housing 54, two chuck tables 58 supported on the turntable 56, rough-grinding means 60 positioned above the turntable 56, and support means 62 that supports the rough-grinding means 60. When the turntable 56 is angularly moved about its own axis, the two chuck tables 58 can alternatively be positioned in a processing area below the rough-grinding means 60 and a wafer loading/unloading area near the guide rail 40 of the feed unit 16. Each of the two chuck tables 58 is capable of holding a wafer under suction on its upper surface. The rough-grinding means 60 is vertically movably supported by the support means 62, and has grinding stones for performing a rough-grinding process on a wafer on each of the chuck tables 58. The finish-grinding unit 22b is similar in structure to the rough-grinding unit 22a except that the finish-grinding unit 22b has finish-grinding means 64 instead of the rough-grinding means 60. Those parts of the finish-grinding unit 22b which are identical to those of the rough-grinding unit 22a are denoted by identical reference characters, and will not be described in detail below. The finish-grinding means 64 is vertically movably supported by the support means 62, and has grinding stones for performing a finish-grinding process on a wafer on each of the chuck tables 58.

The laser processing unit 22c includes a chuck table 68 supported on a unit housing 66, laser beam applying means 70 positioned above the chuck table 68, and support means 72 that supports the laser beam applying means 70. The laser beam applying means 70 is movably supported by the support means 72. The chuck table 68 is movable in a processing-feed direction with respect to the laser beam applying means 70, and is capable of holding a wafer under suction on its upper surface. The laser beam applying means 70 applies a laser beam to a wafer held on the chuck table 68 to perform a predetermined laser processing process on the wafer. The cleaning unit 24 includes known spinner cleaning means for spinner-cleaning a wafer that has been loaded into a cleaning area 74 thereof.

When the units of the processing apparatus 10 are put together as depicted in FIG. 2, the centering unit 18, the wafer inspecting unit 20, the processing units 22a, 22b, and 22c, and the cleaning unit 24 are disposed adjacent to the guide rail 40 of the feed unit 16. The centering unit 18 is also disposed adjacent to the guide rail 34 of the unloading unit 14. The unloading unit 14 and the feed unit 16 operate together to feed wafers to the various units of the processing apparatus 10.

Each of the cassette rest unit 12, the unloading unit 14, the feed unit 16, the centering unit 18, the wafer inspecting unit 20, the rough-grinding unit 22a, the finish-grinding unit 22b, the laser processing unit 22c, and the cleaning unit 24 includes control means, not depicted, for controlling its own operation and working process. The control unit 26 exchanges control signals with these units of the processing apparatus 10 to control the processing apparatus 10 in its entirety.

The control unit 26 includes a display panel 76 for displaying various pieces of information about the processing apparatus 10. When the processing apparatus 10 processes a wafer, the display panel 76 displays an overall apparatus map M1 (FIG. 3) or an overall apparatus map M2 (FIG. 4) that schematically depicts the processing apparatus 10 as viewed in plan, allowing the operator to visually recognize the state of progress of a processing process that is carried out by each unit. The display panel 76 includes a touch-panel display device that displays an input screen for accepting operating actions from the operator.

Items of information to be displayed together with overall apparatus maps on the display panel 76 can be set arbitrarily. For example, the display panel 76 can display, in addition to the state of progress of a processing process that is carried out by each unit referred to above, operating conditions for each unit set depending on wafer properties, error reports for indicating errors that have occurred at predetermined units, and the like. The generation of overall apparatus maps to be displayed on the display panel 76 will be described later.

As depicted in block form in FIGS. 1 and 2, the processing apparatus 10 further includes memory means 78 and calculating means 80. The memory means 78 has an operating condition memory 78a, an image memory 78b, and an overall map memory 78c. The memory means 78 and the calculating means 80 may be incorporated in the control unit 26 or may be provided separately from the control unit 26 and connected to the control unit 26 through a network. For example, a file server provided outside of the processing apparatus 10 may include the memory means 78, and the control unit 26 or other external terminal may access the file server to read information stored in the memory means 78. Details of the memory means 78 and the calculating means 80 will be described later.

For processing wafers on the processing apparatus 10 thus constructed, the wafers to be processed are stored in some or all of the cassettes 32a, 32b, 32c, and 32d. For processing wafers stored in the cassettes 32a, 32b, 32c, and 32d on the processing apparatus 10, the operator enters operating conditions for the units of the processing apparatus 10 into the control unit 26 through the input screen displayed on the display panel 76, and the entered operating conditions are stored as data in the operating condition memory 78a of the memory means 78. The operating conditions include routes along which wafers are fed in the processing apparatus 10, i.e., sequences in which and timings at which wafers are fed between the units, wafer properties including an outside diameter, a thickness, an index size, and a key pattern image for alignment, and the like, cleaning conditions, and other conditions required from the start to end of a processing process.

When the operator enters a processing start signal for a certain wafer, the wafer is unloaded from one of the cassettes 32a, 32b, 32c, and 32d by the unloading unit 14 and fed to the centering unit 18. The centering unit 18 centers the wafer, after which the centered wafer is fed to the wafer inspecting unit 20 by the feed unit 16.

The wafer inspecting unit 20 measures wafer properties of the wafer held on the upper surface of the holding table 50 with the detecting means 52. The control unit 26 compares the measured wafer properties obtained by the detecting means 52 with set values of the wafer properties corresponding to the operating conditions stored in advance in the operating condition memory 78a, and determines whether the wafer fed to the holding table 50 is a wafer corresponding to the operating conditions or not. If the control unit 26 decides that the wafer on the holding table 50 is a proper wafer corresponding to the operating conditions, then the processing apparatus 10 performs a processing process to be described later. If, on the other hand, the control unit 26 decides that the wafer on the holding table 50 is an improper wafer that does not correspond to the operating conditions, then the processing apparatus 10 does not perform a processing process, but performs an error process by reporting an error, returning or loading the wafer to the one of the 32a, 32b, 32c, and 32d from which it was unloaded, and the like.

In the processing process, i.e., after the control unit 26 has decided that the wafer on the holding table 50 is a proper wafer corresponding to the operating conditions, the control unit 26 controls the feed unit 16 to feed the wafer along the predetermined routes included in the operating conditions. Sequences in which and timings at which to feed the wafer to the rough-grinding unit 22a, the finish-grinding unit 22b, the laser processing unit 22c, and the cleaning unit 24 are different depending on the operating conditions. When a processing event at one of the units is completed and the unit sends a process completion signal to the control unit 26, the control unit 26 sends a feed command signal to the feed unit 16, which delivers the wafer to a next unit. In this manner, the wafer is processed by the units included in the operating conditions. When the wafer has been processed by all the units included in the operating conditions, the wafer is fed to the centering unit 18, which centers the wafer. Then, the wafer is carried by the unloading unit 14 and stored in one of the cassettes 32a, 32b, 32c, and 32d.

A wafer is processed according to the processing flow described above. After the processing events at the respective units are finished, a next wafer is sequentially unloaded from one of the cassettes 32a, 32b, 32c, and 32d and processed by the units in the manner described above. In this fashion, a plurality of wafers are successively processed by the processing apparatus 10.

As described above, the processing apparatus 10 is a cluster module system in which a plurality of units can be freely combined and interlinked. If the units that make up the processing apparatus 10 and their layout are changed, then the overall apparatus map displayed on the display panel 76 needs to be changed. The present invention is aimed at making it easy to generate and display an overall apparatus map.

Figure 5:
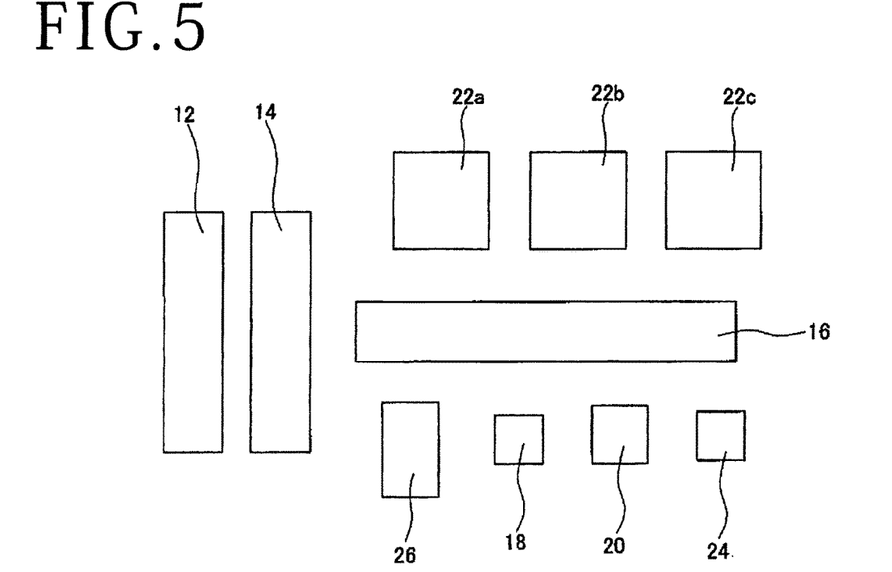
FIG. 5 is a view depicting respective plan-view images of the units of the processing apparatus.

As depicted in FIG. 5, individual plan-view images of the units that make up the processing apparatus 10 as viewed in plan, i.e., the cassette rest unit 12, the unloading unit 14, the feed unit 16, the centering unit 18, the wafer inspecting unit 20, the processing units 22a, 22b, and 22c, the cleaning unit 24, and the control unit 26 as viewed in plan are prepared in advance, and stored in the image memory 78b of the memory means 78. The plan-view images stored in the image memory 78b are represented by image data that are divided for the units, as depicted in FIG. 5. The plan-view images of the units are accompanied by at least floor area information of the units representing outer profiles and dimensions of the units as viewed in plan, which is also stored in the image memory 78b in association with the plan-view images.

The plan-view images (see FIG. 5) of the units can be read from the image memory 78b and combined into an overall apparatus map M1 (see FIG. 3) schematically representing a current overall makeup (see FIG. 2) of the processing apparatus 10. Generating means for generating the overall apparatus map M1 may be provided in any arbitrary location. For example, an image processing circuit and the memory means 78 may be incorporated in the control unit 26, so that the control unit 26 can complete the overall apparatus map M1. Alternatively, the memory means 78 may be provided in an external file server and an image processing circuit may be provided in an external terminal outside of the processing apparatus 10, so that the external terminal can access the file server to remotely generate the overall apparatus map M1. Further alternatively, the memory means 78 may be provided in an external file server and the operator may operate the display panel 76 of the control unit 26 to access the file server to generate the overall apparatus map M1. In either case, the generated overall apparatus map M1 is stored in the overall map memory 78c.

Figure 3:
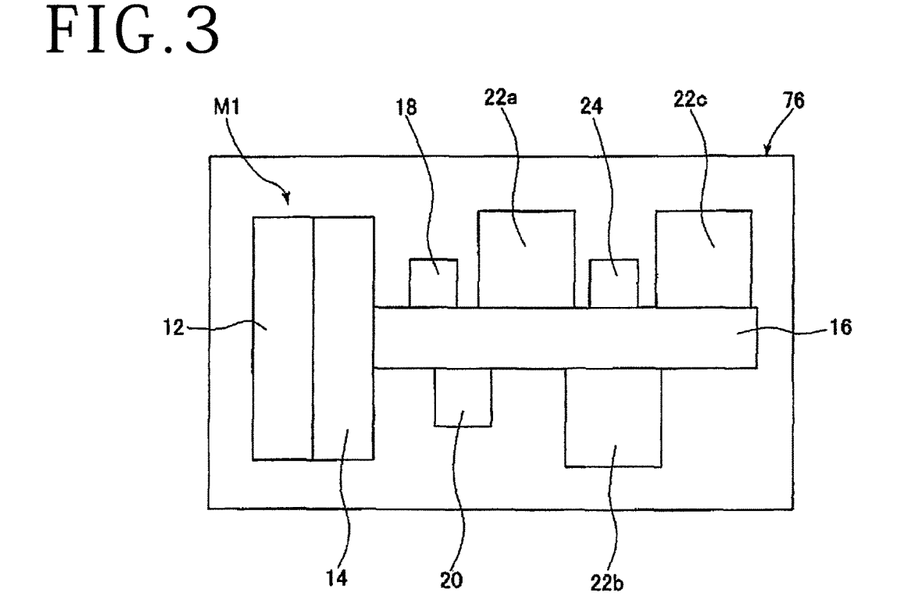
FIG. 3 is a view depicting a displayed example of an overall apparatus map of the processing apparatus.

The generated overall apparatus map M1 reflects actual positional information of the units, i.e., shapes and dimensions of the units as viewed in plan and the distances between the units, of the processing apparatus 10. For example, the overall apparatus map M1 depicted in FIG. 3 corresponds to the layout of the units of the processing apparatus 10 depicted in FIG. 2, as indicated by the arrangement and positional relationship of the units arrayed along the guide rail 40 of the feed unit 16, which are the same in the actual makeup (FIG. 2) of the processing apparatus 10 and the overall apparatus map M1 (FIG. 3).

Figure 4:
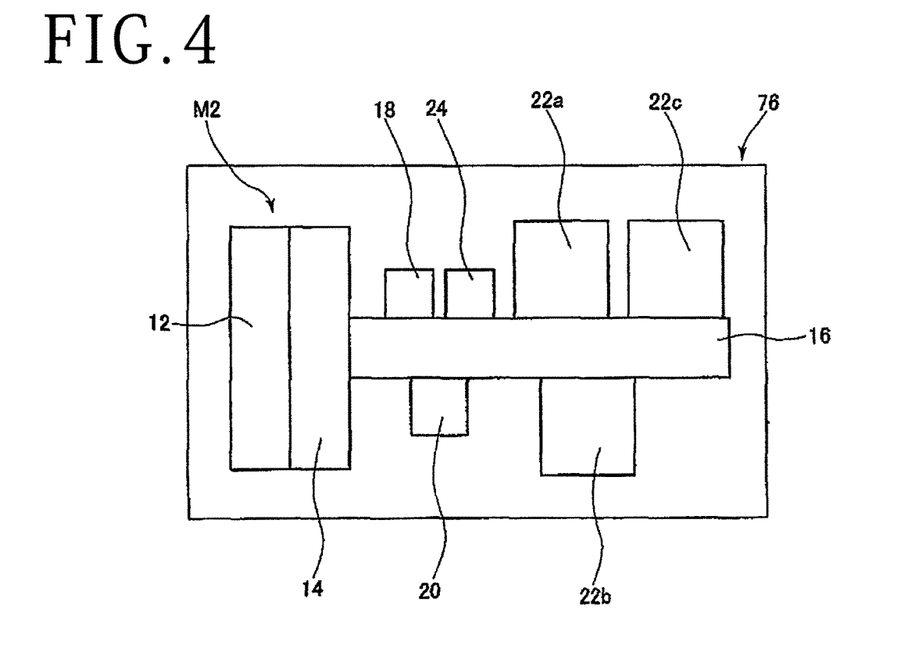
FIG. 4 is a view depicting a different displayed example of an overall apparatus map of the processing apparatus.

For selecting a different unit layout in the processing apparatus 10, the layout of the plan-view images read from the operating condition memory 78a is changed or rearranged to generate a different overall apparatus map. For example, FIG. 4 depicts a different overall apparatus map M2 where the rough-grinding unit 22a and the cleaning unit 24 are switched in the longitudinal direction of the guide rail 40 of the feed unit 16, i.e., the order of the rough-grinding unit 22a and the cleaning unit 24 is reversed from that depicted in FIGS. 2 and 3. When the overall apparatus map is changed, the changed overall apparatus map is stored in the overall map memory 78c.

With the processing apparatus 10 according to the present embodiment, as described above, a plurality of plan-view images representing the units as viewed in plan are prepared in advance as image data of modules whose relative layout can be changed, and the individual plan-view images can freely be combined to generate an overall apparatus map. In this manner, the processing apparatus 10 can generate an overall apparatus map that can easily cope with a change in the unit layout of the cluster module system as the processing apparatus 10.

The generated overall apparatus map M1 or M2 is read from the overall map memory 78c and displayed on the display panel 76 of the control unit 26. The operator who operates the processing apparatus 10 can refer to image information such as icons, arrows, colors, etc. and character information that are displayed together with the overall apparatus map M1 or M2 on the display panel 76, and visually recognize the state of progress of processing and feeding events on the wafer and other various items of information. The operator can also enter operating actions and data into the processing apparatus 10 through the overall apparatus map M1 or M2 displayed on the display panel 76.

Since the control unit 26 does not directly process wafers, the control unit 26 may be omitted from the overall apparatus map M1 or M2 displayed on the display panel 76 during the processing process. The overall apparatus maps M1 and M2 depicted in FIGS. 3 and 4 are devoid of the control unit 26. Conversely, it is possible to generate an overall apparatus map in a display format including the control unit 26. Moreover, the processing apparatus 10 is able to calculate a total processing time (total throughput) per wafer with the calculating means 80 in connection with the generation of an overall apparatus map.

Time elements for determining a processing time for a wafer in the processing apparatus 10 include, first, a processing time at each unit, secondly, an internal feed time in each unit, thirdly, a time required for the unloading unit 14 to load and unload a wafer, and, fourthly, a time required to feed or transfer a wafer between the feed unit 16 and each unit. These time elements are added up to calculate a total throughput.

More specifically, the first time element includes a time required to center a wafer on the centering unit 18, a time required to inspect a wafer on the wafer inspecting unit 20, times required to process a wafer on the processing units 22a, 22b, and 22c, and a time required to clean a wafer on the cleaning unit 24. The second time element includes a time required to move the chuck tables 58 by operating the turntables 56 in the grinding units 22a and 22b, and a time required to move the chuck table 68 into and out of a position below the laser beam applying means 70 in the laser processing unit 22c. As described above, the operating conditions of the units are stored in the operating condition memory 78a of the memory means 78.

The operating conditions include information about the first time element and the second time element. At the time operating conditions are set, information about the first time element and the second time element can be obtained as values inherent in respective wafers. The third time element, though it may differ somewhat depending on which of the cassettes 32a, 32b, 32c, and 32d a wafer to be processed is stored in, may be obtained as inherent information based on operating conditions.

The fourth time element may possibly vary depending on the relative layout of the units of the processing apparatus 10. For example, if the positional relationship of the units is changed, e.g., from the overall apparatus map M1 depicted in FIG. 1 to the overall apparatus map M2 depicted in FIG. 4, then routes along which wafers are fed in the processing apparatus 10, i.e., routes along which the wafer holding means 44 of the feed unit 16 moves, are changed. According to the present embodiment, the feed unit 16 includes only one wafer holding means 44. However, if the feed unit 16 has a plurality of wafer holding means for feeding wafers, then providing the wafer holding means transfer respective wafers to and from a certain unit at overlapping positions, either one of the wafer holding means may have to wait in a waiting time for the transfer of a wafer. Such a waiting time may be eliminated or reduced by changing the unit layout.

The calculating means 80 calculates a total wafer processing time for the present layout of the overall apparatus map on the basis of the information about the processing of wafers on the units and information about the operating conditions stored in the operating condition memory 78a, taking into consideration the effect that the layout of the units has on the fourth time element.

When the contents of the overall apparatus map are changed, the calculating means 80 recalculates a total wafer processing time. For example, if only the layout of the units is changed without changing the number and kinds of the units of the processing apparatus 10 and the properties (first, second, and third time elements) of the wafers stored in the cassettes 32a, 32b, 32c, and 32d, conditions about the fourth time element are changed. By referring to the calculated result from the calculating means 80 in connection with the generation of an overall apparatus map, it is easy for the operator to know a unit layout whose feeding time loss is small and which is of excellent productivity. In particular, if the calculating means 80 calculates a total wafer processing time on the basis of data including information about the relative distances between the units, then the operator can confirm with high accuracy different throughputs of unit layouts that are slightly different from each other.

Specifically, by digitizing a change in the position of the plan-view image of each unit on the display panel 76 on the basis of the number of pixels that make up the display panel 76 and the coordinates set on the display panel 76, the calculating means 80 can calculate a change in the distance by which the feed unit 16 has fed a wafer and a resultant change in the time over which the feed unit 16 has fed a wafer. If it is decided that a waiting time referred to above occurs for the transfer of a wafer due to a change in the position of the plan-view image of each unit on the display panel 76, then the calculating means 80 also adds such a waiting time. The four time element can be determined in this manner.

The calculating means 80 may recalculate a total wafer processing time in real time depending on a change or movement in the layout of the plan-view images of individual units at the time the overall apparatus map is changed, or may recalculate a total wafer processing time altogether at the time a changed overall apparatus map is completed. In either case, total wafer processing times before and after the overall apparatus map is changed may be displayed on the display panel 76 or the like to make it easy for the operator to compare and review throughputs.

When an overall apparatus map is generated, the calculating means 80 calculates a total floor area of the entire processing apparatus 10 in the overall apparatus map of the current layout on the basis of the floor area information of the units that is stored in the image memory 78*b*. By referring to the information of the calculated total floor area, the control unit 26 can determine whether the processing apparatus 10 can be installed in a projected installation area or not.

Broadly, the processing apparatus 10 cannot be installed in an installation area either if the numerical value of the total floor area of the processing apparatus 10 exceeds the floor area of the installation area or if part of the processing apparatus 10 protrudes from the installation area due to configurational limitations though the numerical value of the total floor area of the processing apparatus 10 is equal to or smaller than the floor area of the installation area. The information of the total floor area calculated by the calculating means 80 includes not only the simple numerical value of the floor area, but also the information of the outer profiles of the respective units as viewed in plan and the information of the distances between the units. In the latter case, i.e., if the numerical value of the total floor area of the processing apparatus 10 is equal to or smaller than the floor area of the installation area, but part of the processing apparatus 10 protrudes from the installation area due to configurational limitations, when the layout of the plan-view images of the units in the overall apparatus map is changed, the calculating means 80 updates the total floor area information, and the control unit 26 can determine again whether the overall apparatus map of the new unit layout fits into the installation area or not.

Figure 6:
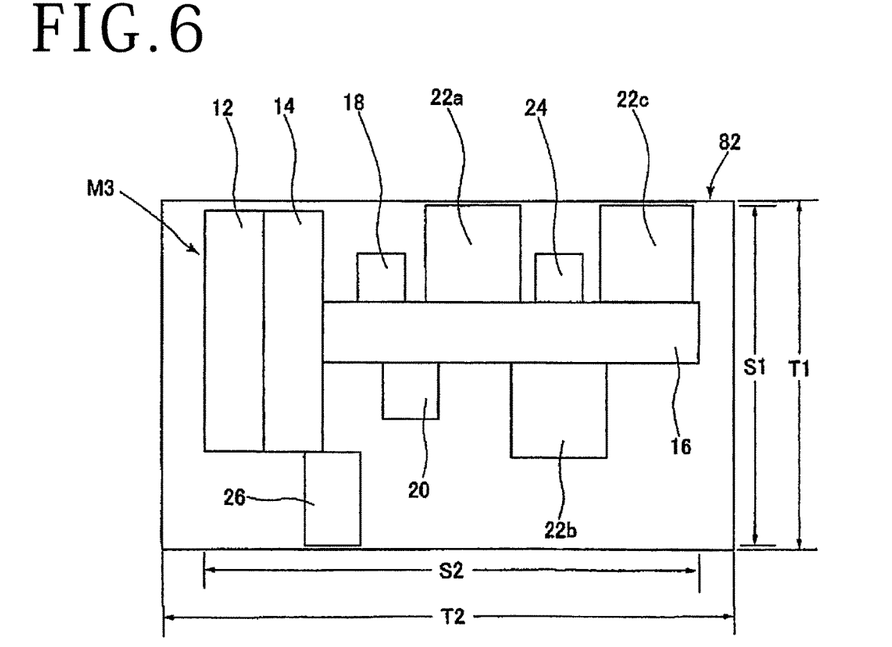
FIG. 6 is a view depicting the relationship between an overall apparatus map of the processing apparatus and an installation area for the processing apparatus.

An example of a process of determining whether the processing apparatus 10 can be installed in an installation area or not is illustrated in FIG. 6. In FIG. 6, a rectangular area 82 represents an installation area, as viewed in plan, where the processing apparatus 10 is to be installed. An overall apparatus map M3 depicted in FIG. 6 represents a plan view of an overall makeup of the processing apparatus 10 that is drawn to scale with the installation area 82. In the example depicted in FIG. 6, the control unit 26 is also installed in the installation area 82, so that the overall apparatus map M3 depicted in FIG. 6 includes the control unit 26 unlike the overall apparatus maps M1 and M2 depicted in FIGS. 3 and 4.

When the installation area 82 and the overall apparatus map M3 are displayed in overlapping relation as depicted in FIG. 6, the control unit 26 can determine whether the processing apparatus 10 can be installed in the installation area 82 or not, i.e., whether the processing apparatus 10 protrudes from the installation area 82 or not. In the example depicted in FIG. 6, since the overall apparatus map M3 fits in the installation area 82, the control unit 26 decides that the processing apparatus 10 can be installed in the installation area 82.

More specifically, inasmuch as the installation area 82 is of a rectangular shape, the control unit 26 compares the maximum vertical and horizontal lengths S1 and S2 (FIG. 6) of the overall apparatus map M3 and the vertical and horizontal lengths T1 and T2 (FIG. 6) of the installation area 82 with each other, and decides that the overall apparatus map M3 fits in the installation area 82 if both $S1 \leq T1$, $S2 \leq T2$ are satisfied. The maximum vertical and horizontal lengths S1 and S2 of the overall apparatus map M3 and the vertical and horizontal lengths T1 and T2 of the installation area 82 can be digitized on the basis of the number of pixels that make up the display panel 76 and the coordinates set on the display panel 76.

As described above, the plan-view images of the units of the processing apparatus 10 are prepared in advance and then combined into an overall apparatus map, and the layout of the plan-view images of the units can freely be changed. Thus, overall apparatus maps corresponding to unit layouts of the cluster module system can flexibly be generated and changed.

In response to a change in the unit layout of an overall apparatus map, a total wafer processing time and a total floor area of the processing apparatus 10 are calculated to simulate a unit layout that is optimum for a throughput and a footprint. As a unit layout is simulated using an overall apparatus map displayed on the display panel 76, rather than changing the actual unit layout of the processing apparatus 10, the effects of a change in the unit layout can be confirmed at no cost and efficiently.

The units of the processing apparatus according to the present invention are not limited to the units illustrated in the above embodiment, but may be any units insofar as they can be used as modules in cluster module systems, and can be used in freely selected combinations. For example, processing units other than the rough-grinding unit 22*a*, the finish-grinding unit 22*b*, the laser processing unit 22*c*, e.g., a cutting unit, a polishing unit, a braking unit, a tape mounting unit, an expanding unit, an edge trimming unit, a plasma etching unit, and the like, may be used as units of the processing apparatus according to the present invention. In addition, the wafer inspecting unit 20, or the like may be omitted from the processing apparatus 10 according to the above embodiment.

The processing apparatus according to the present invention is applicable to a wide variety of workpieces, e.g., a semiconductor device wafer, an optical device wafer, a package board, a semiconductor board, an inorganic material board, an oxide wafer, a raw ceramic board, a piezoelectric board, and the like. The semiconductor device wafer may include a silicon wafer or a compound semiconductor wafer with devices such as ICs or the like formed thereon. The optical device wafer may include a sapphire wafer or a silicon carbide wafer with optical devices such as light emitting diodes (LEDs) or the like formed thereon. The package board may include a chip size package (CSP) board. The semiconductor board may include a board made of silicon, gallium arsenide, or the like. The inorganic material board may include a board made of sapphire, ceramics, glass, or the like. The oxide wafer may include a wafer made of lithium tantalate, lithium niobate, or the like.

In the above embodiment, the plan-view images of the units of an overall apparatus map are each rectangular in shape. However, the plan-view images of the units are not limited to a rectangular shape, but may be of any arbitrary shape. For example, if the plan-view shape of a unit is circular, then its plan-view image may be circular in shape. The plan-view image of a unit which has a complex outer profile may be of a simplified shape, so that the outer profile of an actual unit and the shape of an image thereof may be different from each other. However, with regard to an overall apparatus map that is used to calculate a footprint of the processing apparatus, as is the case with the overall apparatus map M3 depicted in FIG. 6, it is desirable to reflect the outer profiles of actual units in images thereof for acquiring correct floor area information. Though the embodiment of the present invention has been described above, the above embodiment and modifications thereof may be combined wholly or partly as another embodiment of the present invention.

The present invention is not limited to the embodiment described above, but many changes, replacements, and modifications may be made without departing from the scope of the present invention. Furthermore, the present invention may be reduced to practice according to other techniques, processes, schemes, plans, or arrangements insofar as they are capable of implementing the principles of the present invention owing to technological advances or derivations. Therefore, the scope of the appended claims should be interpreted as covering all the embodiments falling within the range of the technical idea of the present invention.

As described above, the present invention is advantageous in that an overall apparatus map can easily be displayed for a processing apparatus in which the layout of units thereof can be changed, and is particularly useful as a processing apparatus for performing a plurality of processing processes on a workpiece.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
a cassette rest unit configured to place thereon a cassette with a plurality of wafers housed therein;
an unloading unit configured to unload a wafer from the cassette placed on said cassette rest unit;
a feed unit configured to feed the wafer unloaded from the cassette by said unloading unit;
a plurality of processing units disposed adjacent to said feed unit and configured to perform respective different processing processes on the wafer; and
a control unit configured to control said cassette rest unit, said unloading unit, said feed unit, and said processing units;
wherein the layout of said cassette rest unit, said unloading unit, said feed unit, and said processing units can be changed;
said control unit includes a display panel for displaying an input screen for entering operating conditions for the units and memory means for storing at least the operating conditions for the units, wherein said memory means includes an operating condition memory for storing operating conditions for a series of units configured to process a wafer in the processing apparatus, and wherein said control unit includes calculating means for at least calculating a total wafer processing time in a current layout of the overall apparatus map on the basis of at least information on the processing of the wafer on the units and information on the operating conditions;
said memory means includes an image memory for preparing in advance and storing respective plan-view images of the units;
said display panel displays an overall apparatus map representing a combination of the plan-view images of the units as a layout of the processing apparatus in its entirety; and
the layout of the plan-view images of the units in said overall apparatus map can be changed.

2. The processing apparatus according to claim 1, wherein said image memory of the memory means stores therein floor area information about the units; and
said calculating means calculates a total floor area of the processing apparatus in its entirety displayed in the overall apparatus map on the basis of the floor area information.

* * * * *